US008441060B2

(12) United States Patent
Ninomiya et al.

(10) Patent No.: US 8,441,060 B2
(45) Date of Patent: May 14, 2013

(54) NONVOLATILE MEMORY ELEMENT AND NONVOLATILE MEMORY DEVICE INCORPORATING NONVOLATILE MEMORY ELEMENT

(75) Inventors: Takeki Ninomiya, Osaka (JP); Koji Arita, Osaka (JP); Takumi Mikawa, Shiga (JP); Satoru Fujii, Osaka (JP)

(73) Assignee: Panasonic Corporation, Osaka (JP)

( * ) Notice: Subject to any disclaimer, the term of this patent is extended or adjusted under 35 U.S.C. 154(b) by 253 days.

(21) Appl. No.: 12/745,599

(22) PCT Filed: Sep. 29, 2009

(86) PCT No.: PCT/JP2009/004976
§ 371 (c)(1),
(2), (4) Date: Jun. 1, 2010

(87) PCT Pub. No.: WO2010/038423
PCT Pub. Date: Apr. 8, 2010

(65) Prior Publication Data
US 2010/0308298 A1 Dec. 9, 2010

(30) Foreign Application Priority Data
Oct. 1, 2008 (JP) ................................. 2008-256027

(51) Int. Cl.
*H01L 29/792* (2006.01)
(52) U.S. Cl.
USPC ............ 257/324; 257/E21.662; 257/E29.309; 438/240
(58) Field of Classification Search .................. 257/296, 257/390, 758, E29.309, E23.147, E21.662; 438/240, 257, 216
See application file for complete search history.

(56) References Cited

U.S. PATENT DOCUMENTS

| 2001/0055838 A1* | 12/2001 | Walker et al. ................. 438/129 |
| 2004/0235200 A1 | 11/2004 | Hsu et al. |
| 2004/0245557 A1 | 12/2004 | Seo et al. |
| 2005/0247921 A1 | 11/2005 | Lee et al. |
| 2006/0011897 A1 | 1/2006 | Hsu et al. |
| 2006/0166476 A1* | 7/2006 | Lee et al. ....................... 438/591 |
| 2007/0114587 A1 | 5/2007 | Seo et al. |
| 2008/0083918 A1 | 4/2008 | Aratani et al. |
| 2009/0014710 A1 | 1/2009 | Kawashima et al. |
| 2009/0230376 A1* | 9/2009 | Ryoo et al. ......................... 257/2 |

FOREIGN PATENT DOCUMENTS

| JP | 2004-349690 A | 12/2004 |
| JP | 2004-363604 A | 12/2004 |
| JP | 2005-317976 A | 11/2005 |
| JP | 2006-040946 A | 2/2006 |

(Continued)

*Primary Examiner* — William F Kraig
(74) *Attorney, Agent, or Firm* — McDermott Will & Emery LLP

(57) ABSTRACT

A nonvolatile memory element includes a first electrode (103) formed on a substrate (101), a resistance variable layer (108) and a second electrode (107), wherein the resistance variable layer has a multi-layer structure including at least three layers which are a first transition metal oxide layer (104), a second transition metal oxide layer (106) which is higher in oxygen concentration than the first transition metal oxide layer (104), and a transition metal oxynitride layer (105). The second transition metal oxide layer (106) is in contact with either one of the first electrode (103) and the second electrode (107). The transition metal oxynitride layer (105) is provided between the first transition metal oxide layer (104) and the second transition metal oxide layer (106).

11 Claims, 9 Drawing Sheets

FOREIGN PATENT DOCUMENTS

| | | |
|---|---|---|
| JP | 2008-512857 T | 4/2008 |
| JP | 2008-244397 A | 10/2008 |
| JP | 2009-021524 A | 1/2009 |
| JP | 2009-049183 A | 3/2009 |
| JP | 2009-218260 A | 9/2009 |
| WO | WO 2006/029228 A2 | 3/2006 |
| WO | WO 2007/102483 A1 | 9/2007 |
| WO | WO 2008/050716 A1 | 5/2008 |

* cited by examiner (a)
103
102
101

(b) 104

(c) 105

NONVOLATILE MEMORY ELEMENT AND NONVOLATILE MEMORY DEVICE INCORPORATING NONVOLATILE MEMORY ELEMENT

RELATED APPLICATIONS

This application is the U.S. National Phase under 35 U.S.C. §371 of International Application No. PCT/JP2009/004976, filed on Sep. 29, 2009, which in turn claims the benefit of Japanese Application No. 2008-256027, filed on Oct. 1, 2008, the disclosures of which Applications are incorporated by reference herein.

TECHNICAL FIELD

The present invention relates to a nonvolatile memory element. More particularly, the present invention relates to a resistance variable nonvolatile memory element which changes its resistance value in response to electric signals applied, a manufacturing method thereof, and a manufacturing method of a nonvolatile semiconductor device incorporating the nonvolatile memory elements.

BACKGROUND ART

With recent advancement of digital technologies, electronic hardware such as portable information devices and home information appliances have been developed to provide higher functionality. For this reason, demands for an increase in a capacity of nonvolatile memory elements, reduction in a write electric power in the memory elements, reduction in write/read time in the memory elements, and longer life of the memory elements have been increasing.

Under the circumstances in which there are such demands, it is said that there is a limitation on miniaturization of the existing flash memory using a floating gate. On the other hand, a nonvolatile memory element (resistance variable memory) using a resistance variable layer as a material of a memory section is formed by a memory element having a simple structure including a resistance variable element. Therefore, further miniaturization, a higher-speed, and lower electric power consumption of the nonvolatile memory elements are expected.

When using the resistance variable layer as the material of the memory section, its resistance value changes from a high-resistance value to a low-resistance value or from the low-resistance value to the high-resistance value, for example, by applying electric pulses thereto. In this case, it is necessary to clearly distinguish two values, which are the high-resistance value and the low-resistance value, to change the resistance value stably between the low-resistance value and the high-resistance value at a high-speed, and to retain these two values in a nonvolatile manner. For the purpose of stabilization of such memory characteristics and miniaturization of memory elements, a variety of proposals have been made in the past.

As one of such proposals, patent document 1 discloses memory elements in which memory cells are formed by resistance variable elements each of which includes two electrodes and a storing layer sandwiched between these electrodes and is configured to reversibly change a resistance value of the storing layer. FIG. 13 is a cross-sectional view showing a configuration of such a conventional memory element.

As shown in FIG. 13, the memory element has a configuration in which plural resistance variable elements 10 forming memory cells are arranged in an array form. The resistance variable element 10 has a configuration in which a high-resistance layer 2 and an ion source layer 3 are sandwiched between a lower electrode 1 and an upper electrode 4. The high-resistance layer 2 and the ion source layer 3 form a storing layer. The storing layer enables data to be stored in the resistance variable element 10 in each memory cell.

Each resistance variable element 10 is disposed above a MOS transistor 18 formed on a semiconductor substrate 11. The MOS transistor 18 includes source/drain regions 13 formed in a region isolated by an element isolating layer 12 inside the semiconductor substrate 11 and a gate electrode 14. The gate electrode 14 also serves as a word line which is one address wire of the memory element.

One of the source/drain regions 13 of the MOS transistor 18 is electrically connected to the lower electrode 1 of the resistance variable element 10 via a plug layer 15, a metal wire layer 16, and a plug layer 17. The other of the source/drain regions 13 of the MOS transistor 18 is connected to the metal wire layer 16 via the plug layer 15. The metal wire layer 16 is connected to a bit line which is the other address wire of the memory element.

By applying electric potentials with different polarities between the lower electrode 1 and the upper electrode 4 of the resistance variable element 10 configured as described above, ion source of the ion source layer 3 forming the storing layer is caused to migrate to the high-resistance layer 2. Or, the ion source is caused to migrate from the high-resistance layer 2 to the upper electrode 4. Thereby, the resistance value of the resistance variable element 10 changes from a high-resistance state value to a low-resistance state value, or from the low-resistance state value to the high-resistance state value, so that data is stored.

Examples using binary transition metal oxides which are different from the resistance variable materials disclosed in Patent document 1 are reported. For example, Patent document 2 discloses as resistance variable materials, $NiO$, $V_2O_5$, $ZnO$, $Nb_2O_5$, $TiO_2$, $WO_3$, and $CoO$.

PRIOR ART DOCUMENTS

Patent Documents

Patent document 1: Japanese Laid-Open Patent Application Publication No. 2006-40946
Patent document 2: Japanese Laid-Open Patent Application Publication No. 2004-363604

SUMMARY OF THE INVENTION

Problems to be Solved by the Invention

However, oxygen in a transition metal oxide forming a resistance variable layer thermally diffuses under the influence of a thermal budget (total heat applied thereto) after forming the resistance variable layer. For this reason, an oxygen concentration profile of the resistance variable layer changes after forming the resistance variable layer.

FIG. 14 is a view showing the relationship between a post-process temperature (maximum temperature in a process step after forming the resistance variable layer) and the initial resistance of the resistance variable layer. As shown in FIG. 13, the initial resistance of the resistance variable layer decreases as the post-process temperature increases.

When the post-process temperature increases only by 50 degrees C., the initial resistance of the resistance variable layer decreases a single digit or larger. Thus, the initial resistance of the resistance variable layer significantly depends on the post-process temperature. A cause of this may be that oxygen thermally diffuses in the above described transition metal oxide forming the resistance variable layer due to a post-process step which is a process step after forming the resistance variable layer. A temperature range of 350 degrees C.~400 degrees C. is used in a wiring step in the existing semiconductor process, and a decrease in the initial resistance due to the diffusion of oxygen occurs inevitably. A change in the initial resistance affects a voltage at which the resistance changing operation starts. Therefore, to implement a nonvolatile memory element using a resistance variable layer as a material of a memory section and a stable operation of a nonvolatile semiconductor device (ReRAM) incorporating the nonvolatile memory element, it is very important to control the oxygen concentration profile of the transition metal oxide forming the resistance variable layer.

A multi-layer cross-point ReRAM includes plural memory array layers each including nonvolatile memory elements arranged in matrix. As the stacked layers increases in number, the thermal budget applied to the resistance variable layers correspondingly increases. Since the thermal budget applied is different between an upper resistance variable layer and a lower resistance variable layer in a multi-layer cross-point ReRAM, the oxygen concentration profile is different between the upper resistance variable layer and the lower resistance variable layer.

The present invention has been developed under the circumstances, and an object of the present invention is to provide a nonvolatile memory element which is high in heat resistance and includes a resistance variable layer with a desired oxygen concentration profile even after the resistance variable layer goes through a semiconductor process step, and a nonvolatile memory device including the nonvolatile memory element.

Means for Solving the Problem

To solve the above described problem, a nonvolatile memory element of the present invention comprises a substrate; a first electrode formed on the substrate; a resistance variable layer formed on the first electrode; and a second electrode formed on the resistance variable layer. The resistance variable layer has a multi-layer structure including at least three layers which are a first transition metal oxide layer, a second transition metal oxide layer which is higher in oxygen concentration than the first transition metal oxide layer, and a transition metal oxynitride layer. The second transition metal oxide layer is in contact with either one of the first electrode and the second electrode. The transition metal oxynitride layer is provided between the first transition metal oxide layer and the second transition metal oxide layer.

Thereby, it is possible to obtain a resistance variable layer having a desired oxygen concentration profile even after the resistance variable layer is subjected to a thermal budget in a post-process step which is a process step after forming the resistance variable layer.

In the nonvolatile memory element, the transition metal oxynitride layer may serve as an oxygen diffusion barrier layer for suppressing diffusion of oxygen from the second transition metal oxide layer to the first transition metal oxide layer.

In the nonvolatile memory element, each of the first transition metal oxide layer and the second transition metal oxide layer may comprise tantalum oxide, and the transition metal oxynitride layer may comprise tantalum oxynitride. Since tantalum is a metal used in the existing semiconductor process, the nonvolatile memory element of the present invention is highly compatible with the semiconductor process.

A method of manufacturing a nonvolatile memory element of the present invention comprises the steps of: forming a first electrode on a substrate; forming a first transition metal oxide layer on the first electrode; forming a transition metal oxynitride layer on the first transition metal oxide layer; forming a second transition metal oxide layer on the transition metal oxynitride layer, the second transition metal oxide layer being higher in oxygen concentration than the first transition metal oxide layer; and forming a second electrode on the second transition metal oxide layer; wherein a resistance variable layer is formed to include the first transition metal oxide layer, the transition metal oxynitride layer and the second transition metal oxide layer.

Another method of manufacturing a nonvolatile memory element of the present invention comprises the steps of: forming a first electrode on a substrate; forming a second transition metal oxide layer on the first electrode; forming a transition metal oxynitride layer on the second transition metal oxide layer; forming a first transition metal oxide layer on the transition metal oxynitride layer, the first transition metal oxide layer being lower in oxygen concentration than the second transition metal oxide layer; and forming a second electrode on the first transition metal oxide layer; wherein a resistance variable layer is formed to include the second transition metal oxide layer, the transition metal oxynitride layer and the first transition metal oxide layer.

In the method of manufacturing the nonvolatile memory element, the transition metal oxynitride layer may be formed by a reactive sputtering process using a transition metal target and using an oxygen gas and a nitrogen gas as reactive gases. In the method of forming the transition metal oxynitride layer by the reactive sputtering process, since a vacuum system is used, the transition metal oxynitride layer is not affected by a natural oxide layer, and nitriding and oxidation can be performed concurrently. Therefore, the composition of the transition metal oxynitride layer can be easily controlled.

In the method of manufacturing the nonvolatile memory element, the transition metal oxynitride layer may be formed by thermally treating the first transition metal oxide layer under a nitrogen-containing atmosphere. Since the deposition speed of the transition metal oxynitride by the reactive sputtering process is as high as about 1 nm/sec, it is difficult to control a several-nm layer thickness. By performing thermal treatment under the nitrogen-containing atmosphere, it is easy to control the thickness of the transition metal oxynitride layer even when the transition metal oxynitride layer is a thin layer with a thickness of about several nm which is controlled with difficulty in the reactive sputtering process.

In the method of manufacturing the nonvolatile memory element, the transition metal oxynitride layer may be formed by plasma-nitriding the first transition metal oxide layer under a nitrogen plasma atmosphere. This makes it easy to control the thickness of the transition metal oxynitride layer even when the transition metal oxynitride layer is a thin layer with a thickness of about several nm which is controlled with difficulty in the reactive sputtering process. Furthermore, the transition metal oxynitride layer can be formed at a lower temperature than in a case where it is formed by thermal treatment under a nitrogen-containing atmosphere.

A nonvolatile semiconductor device of the present invention comprises a substrate; and a memory array including: a plurality of lower wires formed on the substrate to extend in parallel with each other; a plurality of upper wires which are formed above the plurality of lower wires to extend in parallel with each other within a plane parallel to a main surface of the substrate and three-dimensionally cross the plurality of lower wires, respectively; and nonvolatile memory elements which are provided to respectively correspond to three-dimensional cross-points of the plurality of lower wires and the plurality of upper wires; wherein each of the nonvolatile memory elements includes an upper electrode, a lower electrode, and a resistance variable layer, the resistance variable layer has a multi-layer structure including at least three layers which are a first transition metal oxide layer, a second transition metal oxide layer which is higher in oxygen content than the first transition metal oxide layer, and a transition metal oxynitride layer; wherein the second transition metal oxide layer is in contact with either one of the lower electrode and the upper electrode; wherein the transition metal oxynitride layer is provided between the first transition metal oxide layer and the second transition metal oxide layer; and wherein each of the nonvolatile memory elements includes a current controlling element which is electrically connected to the resistance variable layer.

The nonvolatile semiconductor device may further comprise: one or more constituent units being stacked together, the constituent units each including a memory array including the nonvolatile memory elements and the plurality of upper wires.

Thereby, it is possible to achieve a nonvolatile semiconductor device which has a maximized storing surface density. Since the transition metal oxynitride layer serves as an oxygen diffusion barrier layer, diffusion of oxygen which would occur under the influence of thermal budget is suppressed. Further, it is possible to provide a nonvolatile semiconductor device including resistance variable layers having a desired oxygen concentration profile even if the thermal budget increases, by further stacking the constituent units in one or more layers.

The above object, other objects, features, and advantages of the present invention will be apparent by the following detailed description of preferred embodiment of the inventions, with reference to the accompanying drawings.

Effects of the Invention

In accordance with the present invention, it is possible to provide a nonvolatile memory element which is high in heat resistance and includes a resistance variable layer having a desired oxygen concentration profile even after the resistance variable layer is subjected to a thermal budget in a semiconductor process step, and a nonvolatile memory device including the nonvolatile memory element.

EMBODIMENTS FOR CARRYING OUT THE INVENTION

Figure 1:
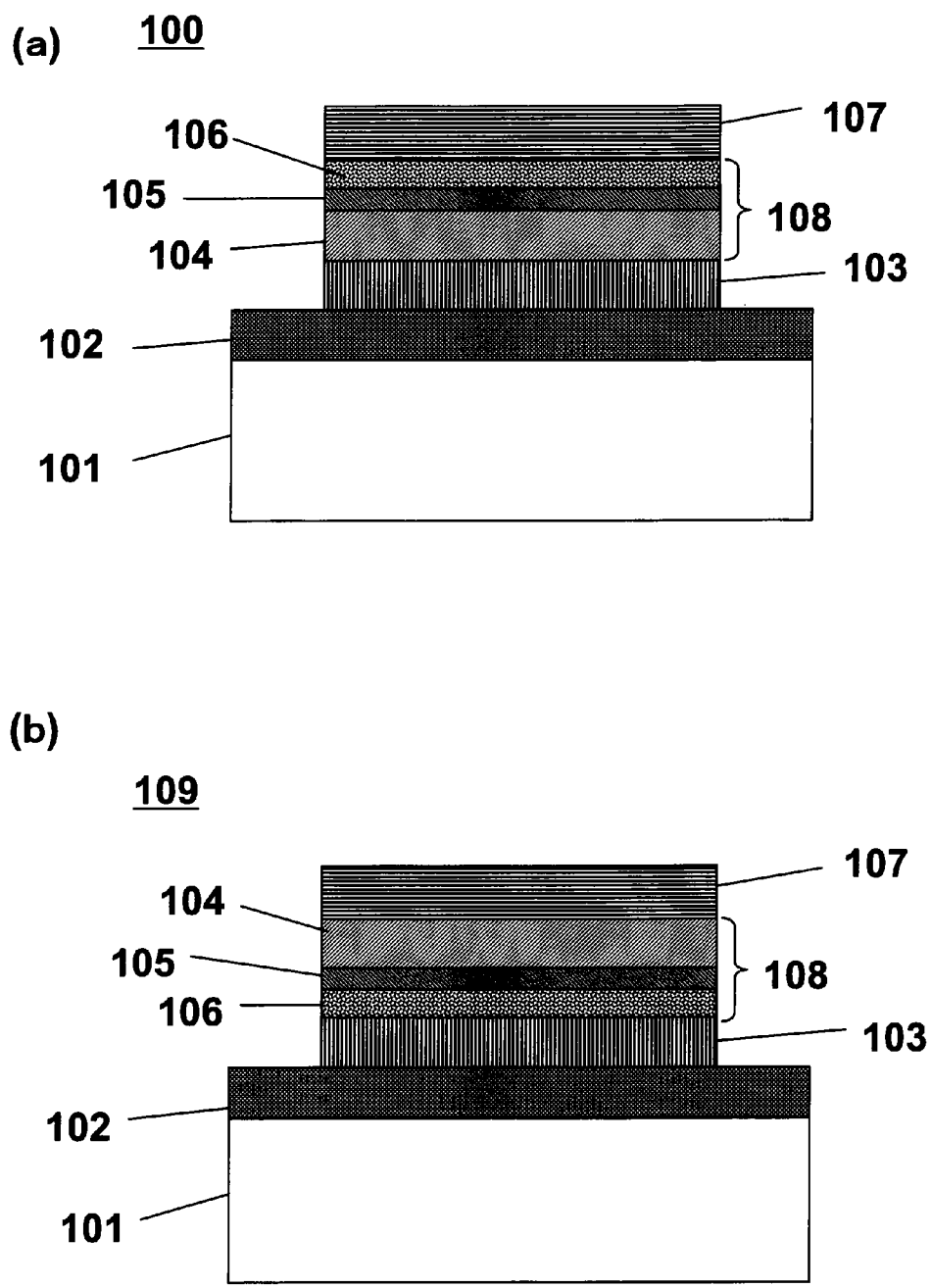
FIG. 1 is a cross-sectional view showing an exemplary configuration of a nonvolatile memory element according to Embodiment 1 of the present invention.

Hereinafter, embodiments of the present invention will be described in detail with reference to the drawings. Throughout the drawings, the same reference numerals are assigned to the same or corresponding parts and description thereof is omitted in some cases.

Embodiment 1

Configuration of Nonvolatile Memory Element

FIG. 1 is a cross-sectional view showing an exemplary configuration of a nonvolatile memory element according to Embodiment 1 of the present invention.

As shown in FIG. 1(a), a nonvolatile memory element 100 includes a substrate 101 and an oxide layer 102 formed on the substrate. On the oxide layer 102, a stacked structure consisting of a first electrode layer 103, a first transition metal oxide layer 104, a transition metal oxynitride layer 105, a second transition metal oxide layer 106 and a second electrode 107 is formed. The second transition metal oxide layer 106 is configured to have a higher oxygen concentration than the first transition metal oxide layer 104. A resistance variable layer 108 includes the first transition metal oxide layer 104, the transition metal oxynitride layer 105 and the second transition metal oxide layer 106.

The transition metal oxynitride layer 105 serves as a barrier for preventing oxygen from diffusing from the second transition metal oxide layer 106 to the first transition metal oxide layer 104. This enables the resistance variable layer 108 to have a desired oxygen concentration profile even after the resistance variable layer 108 is subjected to a thermal budget in a process step after forming the resistance variable layer 108.

It should be noted that in the present invention, a nonvolatile memory element having a structure in which the positional relationship of the upper and lower constituent layers of the resistance variable layer 108 shown in FIG. 1(a) is reversed, i.e., a structure of a nonvolatile memory element 109 shown in FIG. 1(b), can achieve the same advantage.

The first transition metal oxide layer 104 and the second transition metal oxide layer 106 each desirably includes a transition metal oxide so that the resistance value changes upon application of voltages to the nonvolatile memory element. More desirably, the first transition metal oxide layer 104 and the second transition metal oxide layer 106 are made of a transition metal oxide. Most desirably, the first transition metal oxide layer 104 and the second transition metal oxide layer 106 are made of a transition metal oxygen-deficient oxide (oxide which is deficient in oxygen content in terms of a stoichiometric composition: for example, tantalum oxide which satisfies $0<x<2.5$ in $TaO_x$).

As the first transition metal oxide layer 104, tantalum oxide having a composition expressed as $TaO_x$ satisfying, for example, $0.8 \leq x \leq 1.9$ may be used. As the second transition metal oxide layer 106, tantalum oxide having a composition expressed as $TaO_y$ satisfying, for example, $2.1 \leq y < 2.5$ may be used. In such a configuration, redox reaction selectively occurs between the first transition metal oxide layer 104 and the second transition metal oxide layer 106 and the resistance changes stably, upon application of voltages to the resistance variable element.

Suitably, the transition metal oxynitride layer 105 (oxygen diffusion barrier layer) suitably suppress migration (thermal diffusion) of oxygen due to heat which is 500 degree C. or lower, but allows oxygen to migrate therethrough during the resistance changing operation occurring by application of the voltages to the resistance variable element. As the transition metal oxynitride layer 105 having such a characteristic, tantalum oxynitride which does not have a stoichiometric composition is suitable. As used herein, the tantalum oxynitride having a stoichiometric composition is expressed as TaON because tantalum is pentavalent, oxygen is dyad and nitrogen is triad. When the composition of the tantalum oxynitride which does not have a stoichiometric composition as the transition metal oxynitride layer 105 is expressed as $TaO_{x'}N_z$, it is desirable to satisfy $2x'+3z<5$. The ratio between oxygen and nitrogen is not limited.

Examples of the first transition metal oxide layer 104, the second transition metal oxide layer 106 and the transition metal oxynitride layer 105 may be tantalum oxide, and tantalum oxynitride, but are not limited to these. Transition metals other than tantalum, for example, hafnium and zirconium allow an oxygen concentration profile to be effectively controlled in the same manner.

When hafnium oxides is used as the first metal oxide layer and the second transition metal oxide layer, $1.8<y<2.0$ and $0.9 \leq x \leq 1.6$ are desirably satisfied when the composition of the first metal oxide layer and the composition of the second metal oxide layer are expressed as $HfO_x$ and $HfO_y$, respectively. As the transition metal oxynitride layer 105, hafnium oxynitride which does not have a stoichiometric composition is suitable. That is, when the composition of the hafnium oxynitride as the transition metal oxynitride layer 105 is expressed as $HfO_{x'}N_z$, $2x'+3z<4$ is desirably satisfied.

When zirconium oxide is used as the first metal oxide layer and the second transition metal oxide layer, $1.9<y<2.0$ and $0.9 \leq x \leq 1.4$ are desirably satisfied when the composition of the first metal oxide layer and the composition of the second metal oxide layer are expressed as $ZrO_x$ and $ZrO_y$, respectively. As the transition metal oxynitride layer 105, zirconium oxynitride which does not have a stoichiometric composition is suitable. In other words, when the composition of the zirconium oxynitride as the transition metal oxynitride layer 105 is expressed as $ZrO_{x'}N_z$, $2x'+3z<4$ is desirably satisfied.

The above compositions can be measured using Rutherford Backscattering Spectrometry (RBS).

The transition metal oxynitride layer impedes thermal diffusion of oxygen, because the diffusion speed of oxygen ions significantly decreases and passivation of the oxygen ions occurs due to an event that nitrogen atoms compensate for oxygen ion vacancies and form pairs with interstitial oxygen ions. Therefore, in principle, transition metal oxynitrides other than tantalum oxynitride can effectively suppress thermal diffusion of oxygen like this embodiment.

[Manufacturing Method of Nonvolatile Memory Element]

Figure 2:
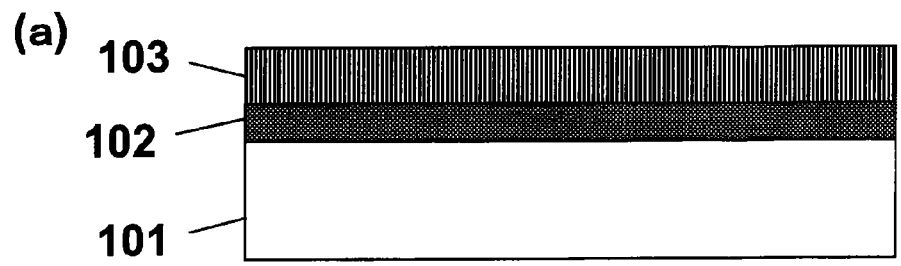
FIG. 2 is a process step view showing a manufacturing method of the nonvolatile memory element according to Embodiment 1 of the present invention.
Figure 2:
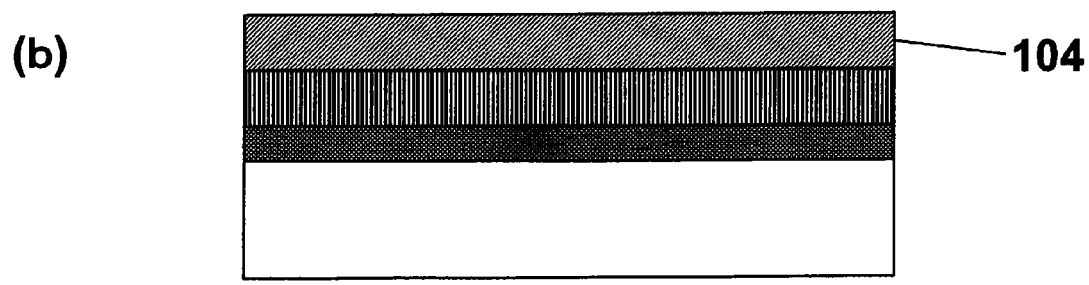
Figure 2:
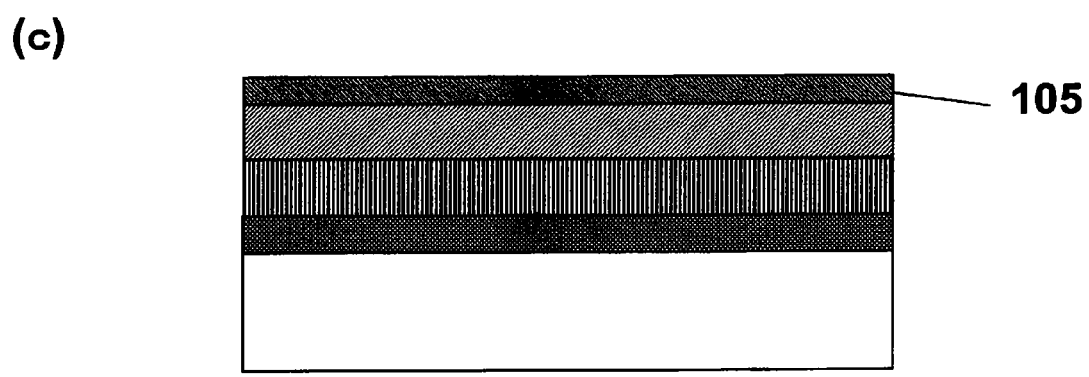

Subsequently, the manufacturing method of the nonvolatile memory element 100 illustrated in FIG. 1(a) will be described with reference to FIG. 2.

Initially, as shown in FIG. 2(a), a silicon oxide layer was deposited over a monocrystalline silicon 101, as the oxide layer 102, by a CVD process. Then, 50 nm-thick tantalum nitride was deposited as the first electrode layer 103 using a reactive sputtering process using metal tantalum as a target and argon and nitrogen as sputtering gases.

Then, as shown in FIG. 2(b), tantalum oxide was deposited over the first electrode layer 103 as the first transition metal oxide layer 104. Tantalum oxide was deposited by a reactive sputtering process using metal tantalum as a target and argon and oxygen as sputtering gases. The diameter of the target was set to 300 mm, the distance between the target and the substrate was set to 160 mm, and a DC power was set to 1600 W. Using argon and oxygen as sputtering gases, the flow rate of oxygen was set to 10~20 sccm and the flow rate of argon was controlled so that the pressure in a deposition chamber reached 0.17 Pa. The deposited tantalum oxide was an oxygen-deficient conductive oxide. The flow rate of oxygen was controlled so that the resistivity of the tantalum oxide was not lower than 0.2 mΩcm and not higher than 100 mΩcm. To derive the resistivity, a sheet resistance of a target layer was measured by a four-terminal measurement using Omnimap 75c made in KLA-TENCOR Corporation, and the resistivity was calculated based on the obtained sheet resistance and the thickness of the target layer measured by other method. A sputtering time was adjusted so that the thickness of the first transition metal oxide layer 104 was not smaller than 25 nm and not larger than 45 nm. The thickness of the first transition metal oxide layer 104 was measured by spectroscopic ellipsometry using UV 1250SE made in KLA-TENCOR Corporation. Then, as shown in FIG. 2(c), tantalum oxynitride was deposited over the first transition metal oxide layer 104 as the transition metal oxynitride layer 105. The tantalum oxynitride layer was deposited by a reactive sputtering process using argon, oxygen and nitrogen as sputtering gases. The DC power of a sputtering device was set to 1600 W, the flow rates of oxygen were set to 5.5 sccm and 6.5 sccm, the flow rate of nitrogen was set to 7.5 sccm, and the flow rate of argon was controlled so that the pressure in a deposition chamber reached 0.17 Pa. The deposited tantalum oxynitride was a conductive oxynitride. The resistivities of this tantalum oxynitride were 7 mΩcm and 20 mΩcm, respectively, with respect to the above oxygen flow rates. The thickness of the transition metal oxynitride layer 105 was not smaller than 3 nm and not larger than 5 nm. The thickness of the transition metal oxynitride layer 105 was controlled by controlling sputtering continuation time during the deposition of the transition metal oxynitride layer 105. To be specific, the thickness of the transition metal oxynitride thin layer which had a thickness of 30 nm or larger which was deposited by the same method that the transition metal oxynitride layer 105 was deposited was measured by SEM cross-section, and the deposition speed of sputtering was calculated based on the thickness of the transition metal oxynitride thin layer which was measured by the SEM cross-section and the sputtering continuation time. The time taken to deposit each of the transition metal oxynitride layers 105 of 3 nm and 5 nm was derived based on the obtained sputtering deposition speed.

Alternatively, the transition metal oxynitride layer 105 may be formed in such a manner that the second transition metal oxide layer 104 is thermally treated under a nitrogen-containing atmosphere after the transition metal oxide layer 104 is formed, or the transition metal oxynitride layer 104 may be formed by plasma nitriding using nitrogen plasma.

The deposition of the transition metal oxynitride layer 105 by the reactive sputtering process has an advantage that the content of oxygen and the content of nitrogen in the transition metal oxynitride layer 105 are easily controlled. The formation of the transition metal oxynitride layer 105 by the thermal treatment under the nitrogen-containing atmosphere or by plasma nitriding has an advantage that the thickness of the transition metal oxynitride layer 105 which is several-nm thick is easily controlled. The plasma nitriding has an advantage that the transition metal oxynitride layer 105 can be formed at a lower temperature than it is formed by thermal treatment under the nitrogen-containing atmosphere.

Figure 3:
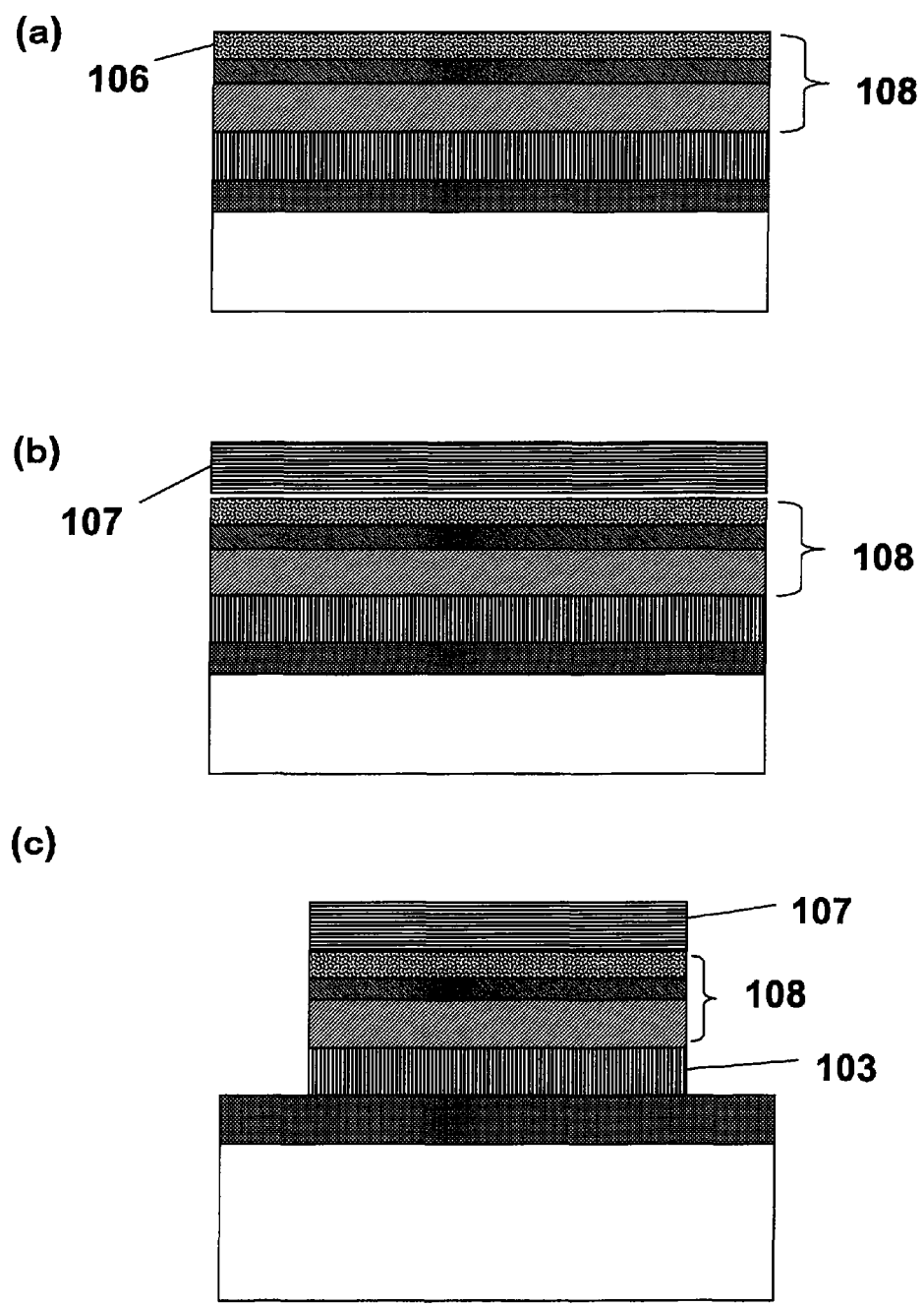
FIG. 3 is a process step view showing a manufacturing method of the nonvolatile memory element according to Embodiment 1 of the present invention.

Then, as shown in FIG. 3(a), over the transition metal oxynitride layer 105, tantalum oxide which was the second transition metal oxide layer 106 was deposited. The second transition metal oxide layer 106 was deposited by a RF magnetron sputtering using a tantalum oxide target having a 6-inch diameter and a composition expressed as $Ta_2O_5$ under the condition in which the RF power was set to 300 W, the pressure in the deposition chamber was set to 3.0 Pa during the deposition, and only argon was used as the sputtering gas. The thickness of the second transition metal oxide layer 106 was set to not smaller than 3 nm and not larger than 5 nm. The thickness of the second transition metal oxide layer 106 was measured by spectroscopic ellipsometry using UV 1250SE made in KLA-TENCOR Corporation.

The resistance variable layer 108 composed of the first transition metal oxide layer 104, the transition metal oxynitride layer 105 and the second transition metal oxide layer 106 has a thickness of 30 nm~100 nm.

As shown in FIG. 3(b), over the second transition metal oxide layer 106, the second electrode layer 107 which was made of 50 nm-thick platinum was deposited by a sputtering process.

Finally, as shown in FIG. 3(c), the first electrode 103, the resistance variable layer 108, and the second electrode 107 were patterned by photolithography, and were processed to have a diameter in a range of 0.5 μm to 2 μm by dry etching.

Although the manufacturing method of the nonvolatile memory element 100 shown in FIG. 1(b) is similar to the manufacturing method of the nonvolatile memory element 100 shown in FIG. 1(a) (FIGS. 1(a)~1(c), FIGS. 2(a)~2(c)), the transition metal oxynitride layer 105 is desirably deposited by a reactive sputtering process. This is because it is difficult to deposit the transition metal oxynitride layer 105 by thermally treating or plasma-nitriding the second transition metal oxide layer 106 under a nitrogen-containing atmosphere, because the oxygen concentration of the second transition metal oxide layer 106 is high.

[Oxygen Diffusion in Nonvolatile Memory Element (Barrier Layer is not Present)]

Subsequently, thermal diffusion of oxygen from the second transition metal oxide layer 106 to the first transition metal oxide layer 104 in the resistance variable layer 108 of this embodiment will be described.

Figure 4:
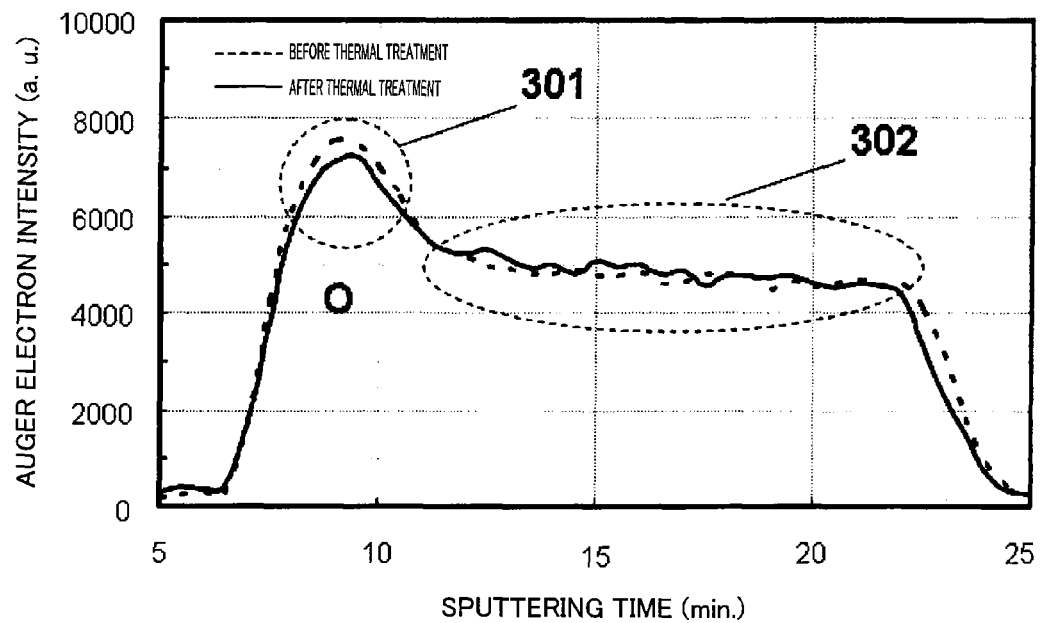
FIG. 4 is a view showing oxygen concentration profiles before and after thermal treatment in a case where an oxygen diffusion barrier layer is not provided.

FIG. 4 is a view showing oxygen concentration profiles of the resistance variable layer 108 in a thickness direction before and after thermal treatment in a case where the transition metal oxynitride layer 105 as the oxygen diffusion barrier layer was not provided. The oxygen concentration profile was measured using Auger spectroscopy. A horizontal axis indicates a sputtering time corresponding to a thickness. A vertical axis indicates an Auger electron intensity corresponding to a concentration of each element. The conditions for the Auger measurement were such that an accelerating voltage was set to 5 kV, a beam current was set to 10 nA, a sample angle was set to 30 degrees C., argon was used as sputtering ions, and the sputtering voltage was set to 0.5 kV or 1 kV. The thermal treatment was performed at 400 degrees C. under nitrogen atmosphere for 10 minutes.

As shown in FIG. 4, it is confirmed that the resistance variable layer 108 had two regions 301 and 302 which were different in oxygen concentration. The high-oxygen-concentration region 301 indicates the above second transition metal oxide layer 106, while the low-oxygen-concentration region indicates the first transition metal oxide layer 104.

When comparison is made between the oxygen concentration profile before thermal treatment and the oxygen concentration profile after thermal treatment, it is observed that the peak intensity of oxygen in the high-oxygen-concentration region 301 (corresponding to the second transition metal oxide layer 106) decreased and the peak intensity of oxygen in the low-oxygen-concentration region 302 (corresponding to the first transition metal oxide layer 104) increased after the thermal treatment. This implies that oxygen in the second transition metal oxide layer 106 diffused to the first transition metal oxide layer 104 due to the thermal treatment.

[Oxygen Diffusion in Nonvolatile Memory Element (Barrier Layer is Present)]

Figure 5:
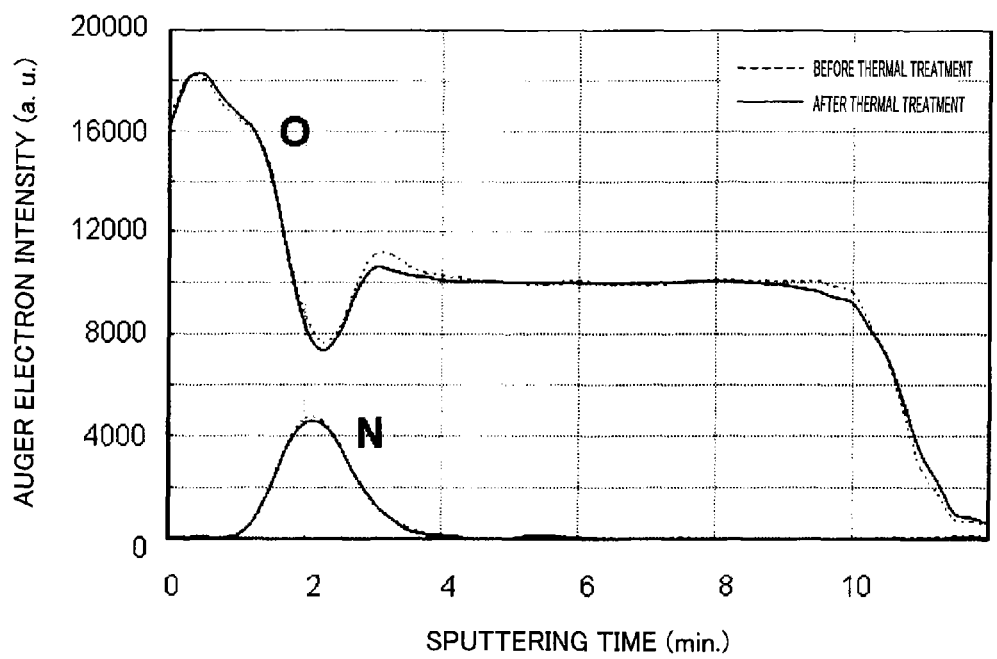
FIG. 5 is a view showing oxygen concentration profiles and nitrogen concentration profiles before and after thermal treatment in a case where tantalum oxynitride with a resistivity of 7 mΩcm is used for the oxygen diffusion barrier layer.
Figure 6:
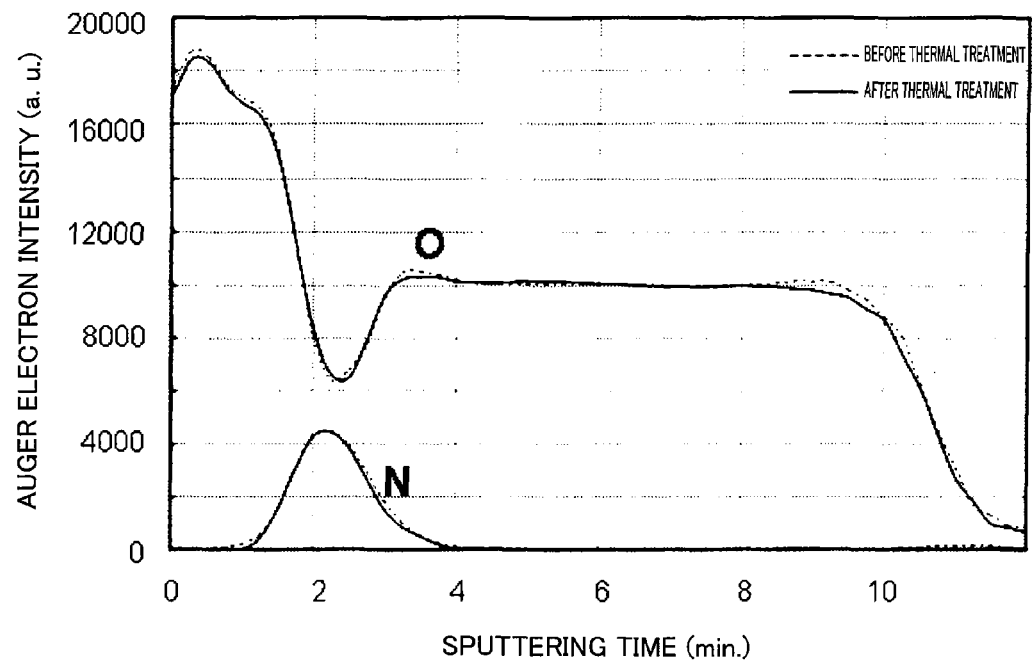
FIG. 6 is a view showing oxygen concentration profiles and nitrogen concentration profiles before and after thermal treatment in a case where tantalum oxynitride with a resistivity of 20 mΩcm is used for the oxygen diffusion barrier layer.

FIG. 5 is a view showing oxygen concentration profiles and nitrogen concentration profiles in a thickness direction before and after thermal treatment in a case where tantalum oxynitride with a resistivity of 7 mΩcm was used for the transition metal oxynitride layer 105. Likewise, FIG. 6 is a view showing oxygen concentration profiles and nitrogen concentration profiles in a thickness direction before and after thermal treatment in a case where tantalum oxynitride with a resistivity of 20 mΩcm was used for the transition metal oxynitride layer 105. The thickness of each transition metal oxynitride layer 105 was set to 5 nm. The thermal treatment was performed at 400 degrees C. under nitrogen atmosphere for 10 minutes. As can be seen from FIGS. 5 and 6, in the case where the transition metal oxynitride layer 105 as the oxygen diffusion barrier layer was provided between the first transition metal oxide layer 104 and the second transition metal oxide layer 106, the peak intensity of oxygen and the peak intensity of nitrogen were substantially unchanged after the thermal treatment.

As can be seen from the results of FIGS. 5 and 6, it is confirmed that the transition metal oxynitride layer 105 served as the oxygen diffusion barrier layer in both cases where tantalum oxynitride with a resistivity of 7 mΩcm was used for the transition metal oxynitride layer 105 and tantalum oxynitride with a resistivity of 20 mΩcm was used for the transition metal oxynitride layer 105. Therefore, the capability of the oxygen diffusion barrier layer does not significantly depend on the composition of the transition metal oxynitride layer 105, and high process controllability is not required in formation of the transition metal oxynitride layer 105.

Hafnium oxide and hafnium oxynitride, or zirconium oxide and zirconium oxynitride can be deposited by the reactive sputtering process using a transition metal target and a sputtering gas which is a mixture of argon gas and oxygen or nitrogen, as in the case of tantalum. The resistivities and thicknesses of these compounds can be measured by a method similar to the method for tantalum.

[Resistance Variable Element Initial Resistance after Thermal Treatment]

Figure 7:
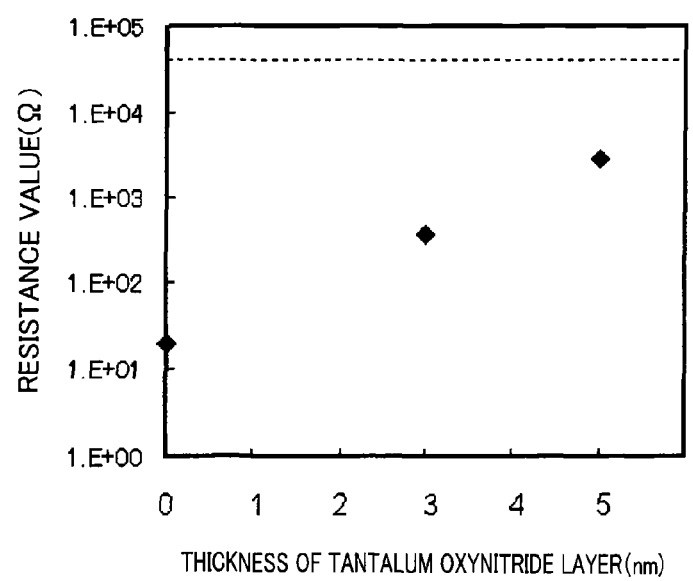
FIG. 7 is a view showing the relationship between the thickness of a tantalum oxynitride layer which is the oxygen diffusion barrier layer and the initial resistance of the resistance variable layer after the thermal treatment.

FIG. 7 shows initial resistance of the resistance variable layer 108 after the thermal treatment in a case where the transition metal oxynitride layer 105 was used as the oxygen diffusion barrier layer. The thickness of the transition metal oxynitride layer was set to 3 nm or 5 nm. FIG. 7 also shows the initial resistance of the resistance variable layer 108 after thermal treatment in the case where the transition metal oxynitride layer 105 was not used, as a case where the thickness of the transition metal oxynitride layer 105 was 0 nm. In FIG. 7, a dotted line indicates the initial resistance of the resistance variable layer 108 before thermal treatment in the case where the transition metal oxynitride layer 105 as the oxygen diffusion barrier layer is not used.

As can be seen from FIG. 7, the initial resistance of the resistance variable layer 108 decreases after it goes through the thermal treatment step. However, a decrease in the initial resistance due to thermal treatment was lessened in a configuration in which the transition metal oxynitride layer 105 was provided than in a configuration in which the transition metal oxynitride layer 105 was not provided. Also, as the thickness of the transition metal oxynitride layer 105 was larger, the initial resistance of the resistance variable layer 108 was higher.

The reason why the resistance value decreases due to the fact that the resistance variable layer 108 goes through the thermal treatment step may possibly be that oxygen diffuses to platinum used as the second electrode as well as oxygen diffusion from the second transition metal oxide layer 106 to the first transition metal oxide layer 104. Since platinum is a metal which allows oxygen to migrate therethrough relatively easily, the resistance value of the resistance variable layer 108 decreases by an event that a part of oxygen in the second transition metal oxide layer 106 migrates toward platinum.

The resistance value of the resistance variable layer after the thermal treatment is not determined only by the diffusion of oxygen from the second transition metal oxide layer 106 to the first transition metal oxide layer 104. Nonetheless, by increasing the thickness of the transition metal oxynitride layer 105, it is possible to more effectively suppress the oxygen diffusion effect from the second transition metal oxide layer 106 to the first transition metal oxide layer 104 and thereby to lessen a decrease rate of the initial resistance of the resistance variable layer 108 after the thermal treatment. In other words, the thermal diffusion of oxygen from the second transition metal oxide layer 106 is suppressed by the oxygen barrier effect of the transition metal oxynitride layer 105, and thereby a decrease rate of the resistance value due to the thermal treatment is suppressed.

[Resistance Changing Operation of Nonvolatile Memory Element]

Figure 8:
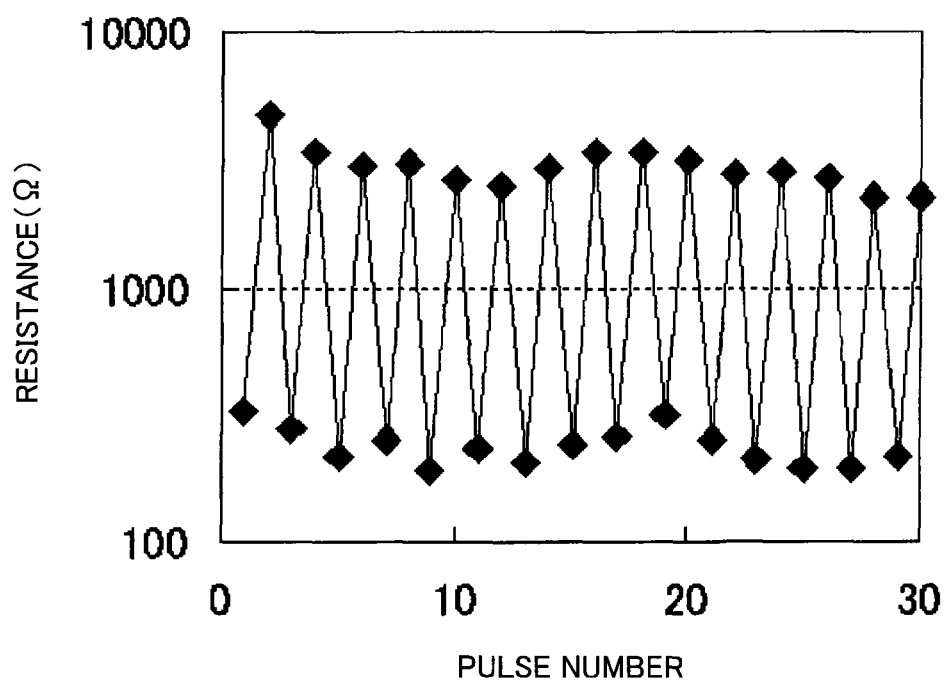
FIG. 8 is a view showing the operation of a nonvolatile memory element 100 as a memory element in a case where tantalum oxynitride with a resistivity of 7 mΩcm is used for the oxygen diffusion barrier layer.

FIG. 8 shows an exemplary operation of the nonvolatile memory element 100 as a memory element, which uses tantalum oxynitride with a resistivity of 7 mΩcm and a thickness of 3 nm as the transition metal oxynitride layer 105, has the structure of FIG. 1(a) and is manufactured by the method shown in FIGS. 2(a)~2(c) and FIG. 3(a)~3(c). The voltage in the case where a positive voltage was applied to the second electrode 107 on the basis of the first electrode 103 was regarded as a positive voltage. In this case, by applying a positive voltage pulse of 2.0V for 100 nsec, the nonvolatile memory element 100 was changed from the low-resistance state to the high-resistance state. After that, by applying a negative voltage pulse of 1.1V for 100 nsec, the nonvolatile memory element 100 was changed from the high-resistance state to the low-resistance state. After that, the positive and negative voltages were applied alternately. FIG. 8 shows the result of resistance changing operation occurring from first to thirty voltage applications performed in this way.

Figure 9:
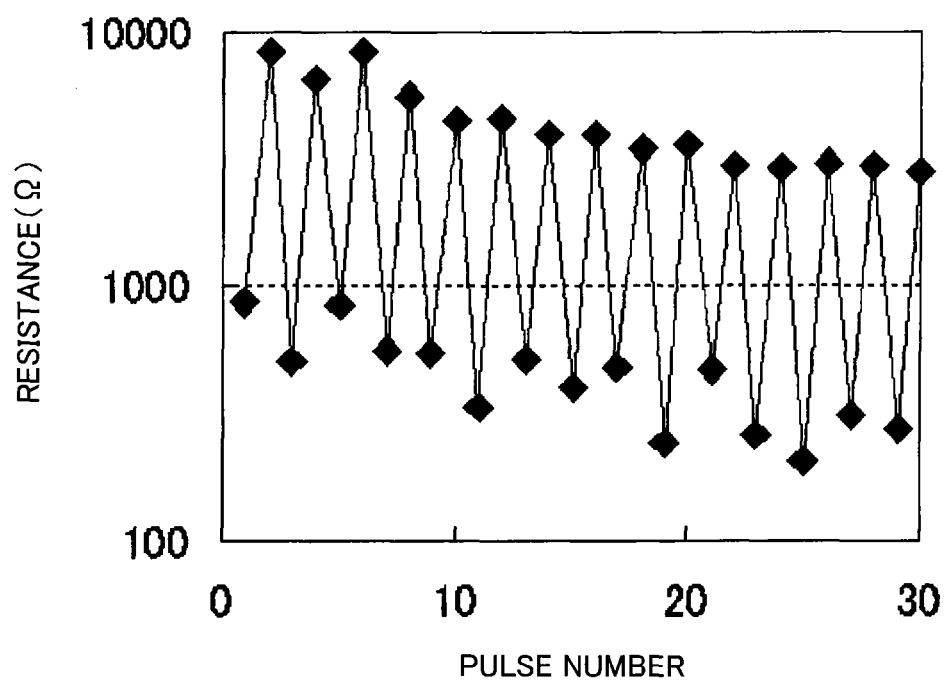
FIG. 9 is a view showing the operation of the nonvolatile memory element 100 as a memory element in a case where tantalum oxynitride with a resistivity of 20 mΩcm is used for the oxygen diffusion barrier layer.

FIG. 9 shows an exemplary operation of the nonvolatile memory element 100 as a memory element, which uses tantalum oxynitride with a resistivity of 7 mΩcm and a thickness of 5 nm as the transition metal oxynitride layer 105, has the structure of FIG. 1(a) and is manufactured by the method shown in FIGS. 2(a)~2(c) and FIG. 3(a)~3(c). The voltage in the case where a positive voltage was applied to the second electrode 107 on the basis of the first electrode 103 was regarded as a positive voltage. In this case, by applying a positive voltage pulse of 2.0V for 100 nsec, the nonvolatile memory element 100 was changed from the low-resistance state to the high-resistance state. After that, by applying a negative voltage pulse of 1.5V for 100 nsec, the nonvolatile memory element 100 was changed from the high-resistance state to the low-resistance state. After that, the positive and negative voltages were applied alternately as in the case where the thickness of tantalum oxynitride layer was set to 3 nm. FIG. 9 shows a result of resistance changing operation occurring from first to thirty voltage applications performed in this way.

From the results of FIGS. 8 and 9, it is confirmed that the nonvolatile memory elements 100 including tantalum oxynitride layers which were 3 nm and 5 nm in thickness as the transition metal oxynitride layers 105 continuously changed resistances about a single digit between the low-resistance state and the high-resistance state. This means that the nonvolatile memory element 100 may be used as the memory element. In many cases, "warm up" operation for applying large voltages to the nonvolatile memory element 100 in an initial stage, which is called "forming," is required to enable the nonvolatile memory element 100 to operate as the memory element. It should be noted that with this structure of this embodiment, the forming may be dispensed with. That is, the nonvolatile memory element 100 of the present invention is able to change its resistance without the forming even when the transition metal oxynitride layer 105 is included in the resistance variable layer 108 forming the nonvolatile memory element 100.

It should be noted that the above mentioned resistance changing characteristic of the nonvolatile memory element shown in FIG. 1(a) is achieved in the same manner in the structure in which the vertical relationship between the first transition metal oxide layer 104 and the second transition metal oxide layer 106 is reversed as shown in FIG. 1(b).

[Explanation of Resistance Changing Operation]

As shown in FIG. 1, the resistance variable layer 108 of the nonvolatile memory element 100 of this embodiment has a stacked structure in which the first transition metal oxide layer 104, the transition metal oxynitride layer 105 and the second transition metal oxide layer 106 are stacked together. The oxygen content of the second transition metal oxide layer 106 is higher than the oxygen content of the first transition metal oxide layer 104, and therefore, the resistance value of the second transition metal oxide layer 106 is higher than the resistance value of the first transition metal oxide layer 104.

In the above structure, upon application of voltages to the nonvolatile memory element 100, oxygen ions migrate between the second transition metal oxide layer 106 and the first transition metal oxide layer 104 via the transition metal oxynitride layer 105 (oxygen diffusion barrier layer). For example, upon application of a negative voltage pulse to the nonvolatile memory element 100, oxygen migrates from the second metal oxide layer 106 to the first metal oxide layer 104, so that the oxygen content of the second transition metal oxide layer 106 in the high-resistance state decreases and the resistance value of the second transition metal oxide layer 106 is lowered. As a result, the nonvolatile memory element 100 is placed into the low-resistance state.

[Influence of Oxygen Diffusion Barrier Layer During Resistance Changing Operation]

As shown in FIGS. 4 and 5, the transition metal oxynitride layer 105 serves as the oxygen diffusion barrier layer for suppressing the diffusion of oxygen from the second transition metal oxide layer 106 to the first transition metal oxide layer 104 under 400 degrees C. atmosphere. During the resistance changing operation, the voltage applied to the resistance variable layer 108 is not lower than 1V, and therefore, the energy given to the resistance variable layer 108 is not lower than 1 eV. In contrast, the heat energy given to the resistance variable layer 108 under 400 degrees C. is about 0.06 eV (heat energy is a product of Boltzman constant and absolute temperature). Thus, regarding the energy amount which contributes to the migration of oxygen, the electric energy during the resistance changing operation is higher than the heat energy given after forming the resistance variable layer 108. Since the electric energy higher than the heat energy (thermal budget) given by a post-process step (process step after forming the resistance variable layer) is given during the resistance changing operation, the transition metal oxynitride layer 105 in this embodiment allows oxygen to migrate therethrough, thereby enabling the nonvolatile memory element 100 to perform the resistance changing operation.

Embodiment 2

The above described nonvolatile memory element of Embodiment 1 is applicable to so-called a multi-layer cross-point nonvolatile semiconductor device in which memory arrays each including a plurality of lower wires, a plurality of upper wires crossing the lower wires, respectively, and the nonvolatile memory elements arranged at cross points of the upper wires and the lower wires are three-dimensionally stacked together to form a multi-layer structure. This will be described below.

[Explanation of Multi-Layer Cross-Point ReRAM]

Figure 10:
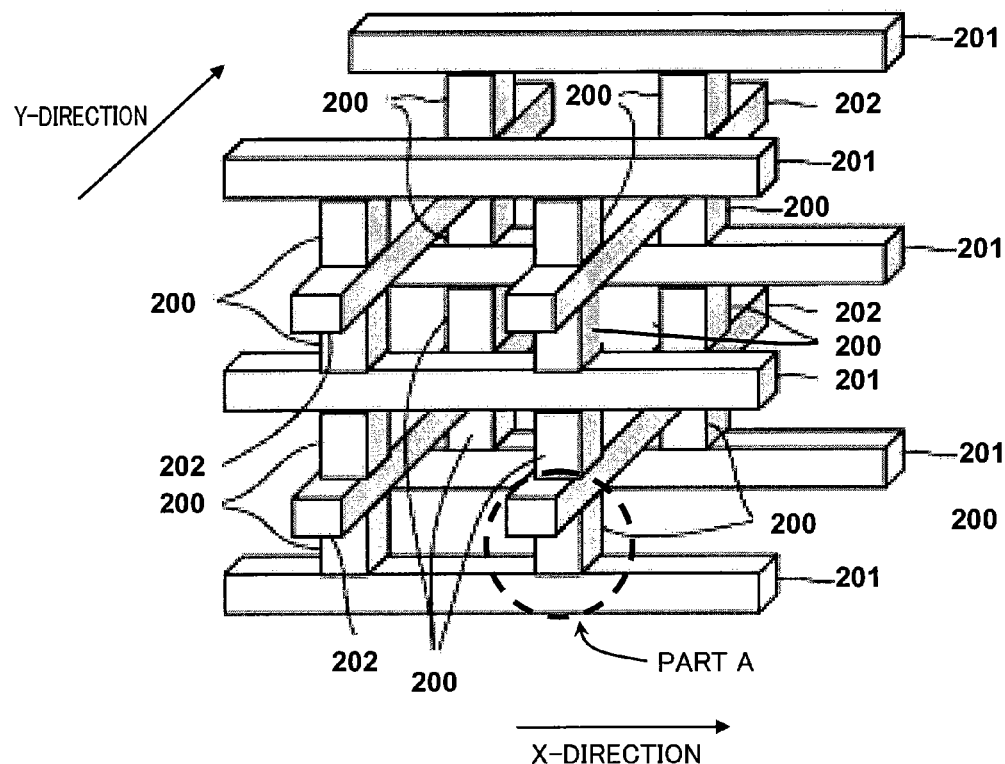
FIG. 10 is a perspective view showing a configuration of a multi-layer memory array in a multi-layer cross-point nonvolatile semiconductor device according to Embodiment 2 of the present invention.

FIG. 10 is a perspective view showing a configuration of a memory array in the above described multi-layer cross-point nonvolatile semiconductor device. In FIG. 10, for easier explanation, an example in which memory elements (memory cells) of (2 elements×2 elements) in X-direction and in Y-direction are stacked in four layers is illustrated. As shown in FIG. 10, this nonvolatile semiconductor device includes a multi-layer memory array which is composed of a plurality of memory arrays which are stacked together, each memory array including a plurality of lower wires 201 formed to extend in parallel with each other on a semiconductor substrate which is not shown, a plurality of upper wires 202 which are formed above the plurality of lower wires 201 to extend in parallel with each other within a plane parallel to the main surface of the semiconductor substrate and three-dimensionally cross the plurality of lower wires 201, respectively, and a plurality of nonvolatile memory elements 200 arranged in matrix to respectively correspond to three-dimensional cross points of the plurality of lower wires 201 and the plurality of upper wires 202.

Although in the example of FIG. 9, the wire layers are arranged in five layers and the nonvolatile memory elements provided at the three-dimensional cross-points of the wire layers are arranged in four layers, the number of these layers may be increased or decreased as desired. In addition, the number of memory elements arranged in X-direction and in Y-direction may be suitably changed.

[Configuration of Nonvolatile Memory Element Included in Nonvolatile Semiconductor Device of Embodiment 2]

Figure 11:
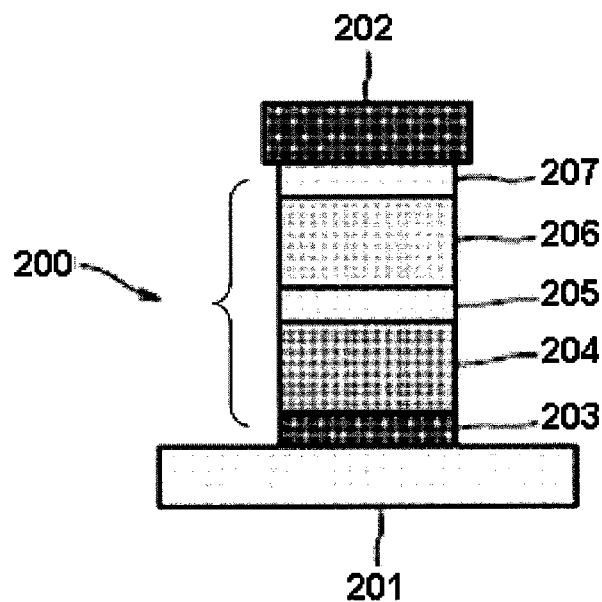
FIG. 11 is a cross-sectional view showing an exemplary configuration of a nonvolatile memory element included in the nonvolatile semiconductor device according to Embodiment 2 of the present invention.

FIG. 11 is a cross-sectional view showing an exemplary configuration of a nonvolatile memory element according to Embodiment 2 of the present invention. In FIG. 11, a configuration of part A of FIG. 10 is shown.

As shown in FIG. 11, the nonvolatile memory element included in the nonvolatile semiconductor device according to this Embodiment intervenes between the lower wire 21 which is a copper wire and the upper wire 202 which is a copper wire, and includes a lower electrode 203, a current controlling element 204, an inner electrode 205, a resistance variable layer 206 and an upper electrode 207 which are stacked together in this order.

Since voltages with different polarities are applied to the resistance variable layer 206, a diode composed of the lower electrode 203, the current controlling element 204 and the inner electrode 205 is required to be a bidirectional diode having a current steering property with respect to applied voltages with different polarities. For this reason, the diode composed of the lower electrode 203, the current controlling element 204 and the inner electrode 205 may be a MSM diode in which the current controlling element 204 is a semiconductor, or a MIM diode in which the current controlling element 204 is an insulator. In such a configuration, it is possible to achieve a nonvolatile memory element which can prevent cross talk due to a leak current from unselected memory cells other than a memory cell (selected memory cell) for which reading and writing is performed, while flowing a sufficient current to the selected memory cell when reading and writing is performed, and has high reproducibility in resistance changing characteristic and high reliability.

The inner electrode 205, the resistance variable layer 206 and the upper electrode 207 correspond to the first electrode 103, the resistance variable layer 108 and the second electrode layer 107 in the nonvolatile memory element 100 according to Embodiment 1 shown in FIG. 1, respectively.

Figure 12:
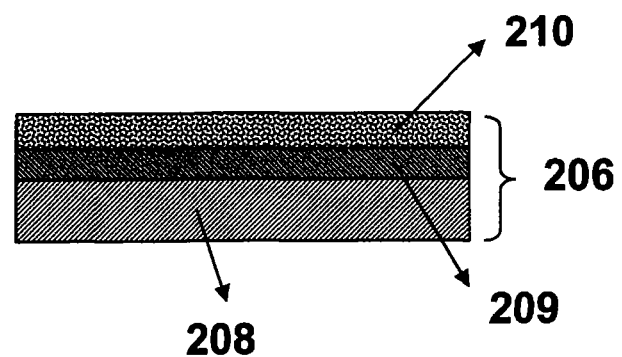
FIG. 12 is a cross-sectional view of a resistance variable layer according to Embodiment 2 of the present invention.
Figure 13:
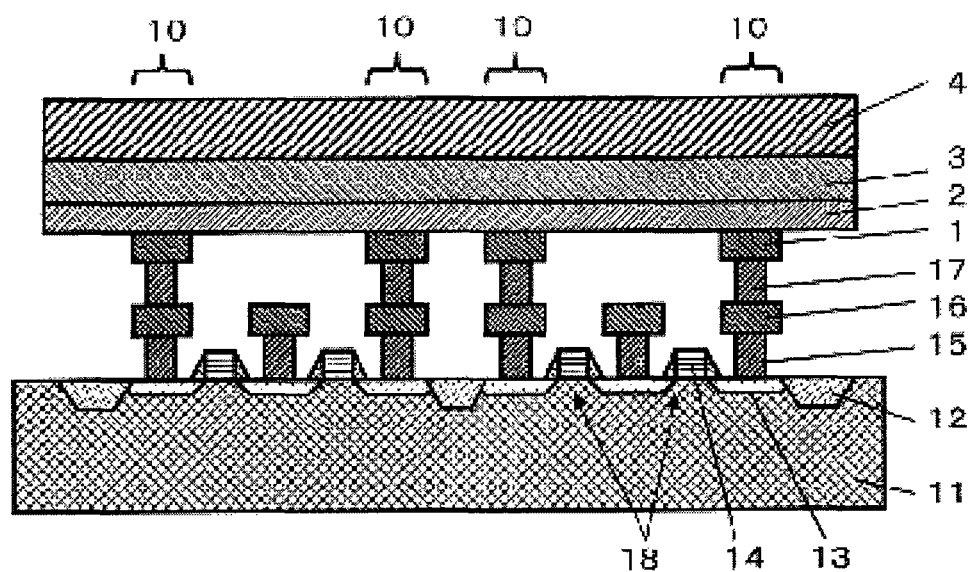
FIG. 13 is a cross-sectional view showing a configuration of a conventional nonvolatile memory element.
Figure 14:
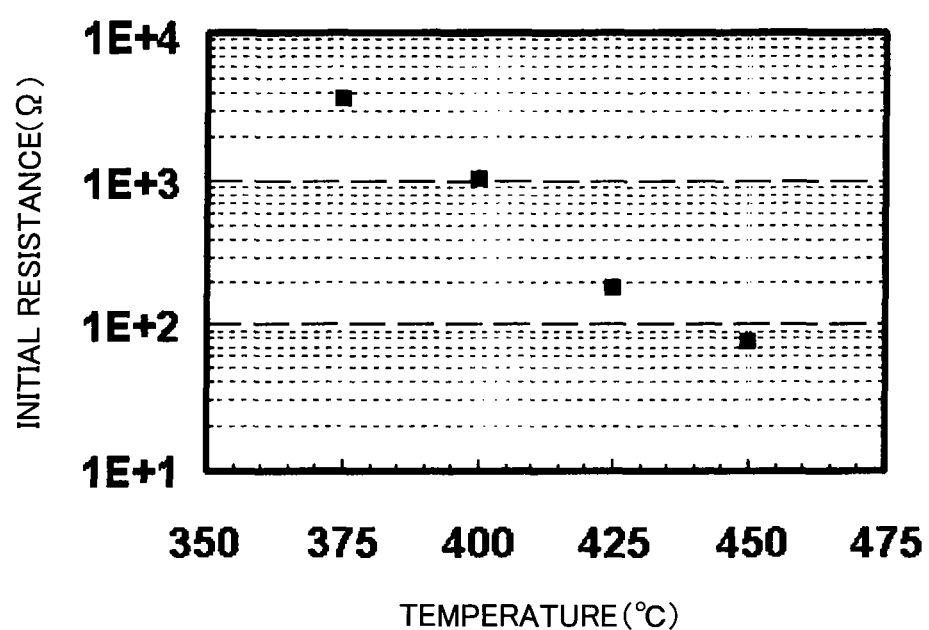
FIG. 14 is a view showing the relationship between the post-process temperature of a resistance variable layer and the initial resistance of the resistance variable layer in a case where the oxygen diffusion barrier layer is not provided.

FIG. 12 shows a cross-sectional structure of the resistance variable layer 206 according to Embodiment 2. The resistance variable layer 206 includes a first transition metal oxide layer 208 which is oxygen deficient, a transition metal oxynitride layer 209 formed on the first transition metal oxide layer 208, and a second transition metal oxide layer 210 formed on the transition metal oxynitride layer 209. The second transition metal oxide layer 210 has a feature that its oxygen content is higher than the oxygen content of the first transition metal oxide layer 208. As in the case described in Embodiment 1, the transition metal oxynitride layer 209 serves as an oxygen diffusion barrier layer for suppressing diffusion of oxygen from the second transition metal oxide layer 210 to the first transition metal oxide layer 208.

In a semiconductor process step, it is necessary to increase the temperature up to 350 degrees C. or higher in a step for forming wires and up to about 400 degrees C. in a step for forming an interlayer insulating layer between lower wires and upper wires, every time one layer of a memory array and wire layers is formed. For this reason, in a multi-layer cross point nonvolatile semiconductor device, a thermal budget applied to a nonvolatile memory element in a lower layer is different from a thermal budget applied to a nonvolatile memory element in an upper layer. Since an average diffusion distance of oxygen correlates with the thermal budget, there is a difference in oxygen concentration profile between the resistance variable layer 206 in a lower layer and the resistance variable layer 206 in an upper layer, in the multi-layer cross-point nonvolatile semiconductor device.

However, by using the nonvolatile semiconductor device having the configuration of this Embodiment, the transition metal oxynitride layer 209 serves as the oxygen diffusion barrier layer to suppress thermal diffusion of oxygen in the resistance variable layer 206 including the transition metal oxynitride layer 209, as should be clear from the description in Embodiment 1. Therefore, in a case where a multi-layer cross point nonvolatile semiconductor device is manufactured, it is possible to form a resistance variable layer having a designed oxygen concentration profile for every individual nonvolatile memory element.

Numerous modifications and alternative embodiments of the invention will be apparent to those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the spirit of the invention.

INDUSTRIAL APPLICABILITY

A nonvolatile memory element and nonvolatile memory device of the present invention are useful as a nonvolatile memory element and nonvolatile memory device including the nonvolatile memory element, which have high heat resistance and include a resistance variable layer having a desired oxygen concentration profile even after the resistance variable layer is subjected to a thermal budget in a semiconductor process step.

EXPLANATION OF REFERENCE NUMERALS 100 nonvolatile memory element
101 substrate
102 oxide layer
103 first electrode
104 first transition metal oxide layer
105 transition metal oxynitride layer
106 second transition metal oxide layer
107 second electrode
108 resistance variable layer
109 nonvolatile memory element
200 nonvolatile memory element
201 lower wire
202 upper wire
203 lower electrode
204 current controlling element
205 inner electrode
206 resistance variable layer
207 upper electrode
208 first transition metal oxide layer
209 transition metal oxynitride layer
210 second transition metal oxide layer

The invention claimed is:

1. A nonvolatile memory element comprising:
a substrate;
a first electrode formed on the substrate;
a resistance variable layer formed on the first electrode; and
a second electrode formed on the resistance variable layer, wherein:
the resistance variable layer has a multi-layer structure including at least three layers which are a first transition metal oxide layer, a second transition metal oxide layer which is higher in oxygen concentration than the first transition metal oxide layer, and a transition metal oxynitride layer,
the second transition metal oxide layer is in contact with either one of the first electrode and the second electrode,
the transition metal oxynitride layer is provided between the first transition metal oxide layer and the second transition metal oxide layer,
the first transition metal oxide layer is in contact with the transition metal oxynitride layer, and
the transition metal oxynitride layer does not have a stoichiometric composition.

2. The nonvolatile memory element according to claim 1, wherein the transition metal oxynitride layer serves as an oxygen diffusion barrier layer for suppressing diffusion of oxygen from the second transition metal oxide layer to the first transition metal oxide layer.

3. The nonvolatile memory element according to claim 1, wherein each of the first transition metal oxide layer and the second transition metal oxide layer comprises tantalum oxide, and the transition metal oxynitride layer comprises tantalum oxynitride.

4. The nonvolatile memory element according to claim 3, wherein the tantalum oxide is oxygen-deficient tantalum oxide.

5. The nonvolatile memory element according to claim 4, wherein:
the oxygen-deficient tantalum oxide of the first transition metal oxide layer is expressed as $TaO_x$ satisfying $0.8 \leq x \leq 1.9$, and
the oxygen-deficient tantalum oxide of the second transition metal oxide layer is expressed as $TaO_x$ satisfying $2.1 \leq x \leq 2.5$.

6. The nonvolatile memory element according to claim 1, wherein the transition metal oxynitride layer includes tantalum oxynitride expressed as $TaO_{x'}N_z$, satisfying $2x'+3z<5$.

7. The nonvolatile memory element according to claim 1, wherein the transition metal oxynitride layer includes hafnium oxide or zirconium oxide.

8. The nonvolatile memory element according to claim 1, wherein a thickness of the transition metal oxynitride layer is 3 nm or more and 5 nm or less.

9. The nonvolatile memory element according to claim 1, wherein the first transition metal oxide includes oxygen-deficient conductive oxide.

10. A nonvolatile semiconductor device comprising:
a substrate; and
a memory array including:
a plurality of lower wires formed on the substrate, the plurality of lower wires extending in parallel with each other;
a plurality of upper wires which are formed above the plurality of lower wires and extend in parallel with each other within a plane parallel to a main surface of the substrate and three-dimensionally cross the plurality of lower wires, respectively; and nonvolatile memory elements which are provided to respectively correspond to three-dimensional crosspoints of the plurality of lower wires and the plurality of upper wires, wherein:

each of the nonvolatile memory elements includes an upper electrode, a lower electrode and a resistance variable layer, the resistance variable layer has a multi-layer structure including at least three layers which are a first transition metal oxide layer, a second transition metal oxide layer which is higher in oxygen content than the first transition metal oxide layer, and a transition metal oxynitride layer, the second transition metal oxide layer is in contact with either one of the lower electrode and the upper electrode, the transition metal oxynitride layer is provided between the first transition metal oxide layer and the second transition metal oxide layer, each of the nonvolatile memory elements includes a current controlling element which is electrically connected to the resistance variable layer, the first transition metal oxide layer is in contact with the transition metal oxynitride layer, and the transition metal oxynitride layer does not have a stoichiometric composition.

11. The nonvolatile semiconductor device according to claim 10, further comprising: one or more constituent units being stacked together, the constituent units each including a memory array including the nonvolatile memory elements and the plurality of upper wires.

* * * * *